United States Patent [19]
Okano

[11] Patent Number: 5,645,698
[45] Date of Patent: Jul. 8, 1997

[54] TOPOGRAPHICALLY PRECISE THIN FILM COATING SYSTEM

[75] Inventor: Manabu Okano, Tokyo, Japan

[73] Assignee: Advanced Energy Industries, Inc., Fort Collins, Colo.

[21] Appl. No.: 296,093

[22] Filed: Aug. 25, 1994

Related U.S. Application Data

[63] Continuation of Ser. No. 954,151, Sep. 30, 1992, abandoned.

[51] Int. Cl.$^6$ .................................................. C23C 14/34
[52] U.S. Cl. ........................ 204/192.12; 204/192.14; 204/192.15; 204/298.08; 204/298.11
[58] Field of Search ........................ 204/192.12, 192.13, 204/192.14, 192.15, 298.03, 298.08, 298.11, 298.32, 298.34

[56] References Cited

U.S. PATENT DOCUMENTS

| | | | |
|---|---|---|---|
| 4,103,324 | 7/1978 | Vandervelden et al. | 363/89 |
| 4,181,541 | 1/1980 | LeFrancois | 148/16.6 |
| 4,194,930 | 3/1980 | Tanaka et al. | 148/16.6 |
| 4,710,694 | 12/1987 | Sutphin et al. | 320/21 |
| 4,711,767 | 12/1987 | Diedreich | 422/186 |
| 4,931,169 | 6/1990 | Scherer et al. | 204/298.08 X |
| 4,936,960 | 6/1990 | Siefkes et al. | 204/192 |
| 4,963,238 | 10/1990 | Siefkes et al. | 204/192.12 |
| 4,981,566 | 1/1991 | Wurczinger | 204/192.13 |
| 5,006,213 | 4/1991 | Sichman et al. | 204/298.14 |
| 5,009,764 | 4/1991 | Siefker et al. | 204/298.04 |
| 5,074,984 | 12/1991 | Sichman et al. | 204/298.14 |
| 5,108,571 | 4/1992 | Ludwig et al. | 204/192.13 |
| 5,126,033 | 6/1992 | Czczyrbowski et al. | 204/298.08 |
| 5,192,894 | 3/1993 | Teschner | 315/111.21 |

FOREIGN PATENT DOCUMENTS

| | | |
|---|---|---|
| 0553410 | 8/1993 | European Pat. Off. . |
| 221202A | 4/1985 | German Dem. Rep. . |
| 229160A | 10/1985 | German Dem. Rep. . |
| 3919147A1 | 6/1989 | Germany . |
| 0564789A1 | 3/1992 | Germany . |
| 3121389 | 8/1992 | Germany . |
| 4113704 | 10/1992 | Germany . |
| 67069-324 | 4/1982 | Japan . |
| 61-030-665-A | 2/1986 | Japan . |
| 63-190-168-A | 8/1988 | Japan . |
| 1-14312 | 3/1989 | Japan . |
| 3056-671-A | 3/1991 | Japan . |
| 3-61368 | 3/1991 | Japan . |
| 2045553 | 10/1990 | United Kingdom . |

OTHER PUBLICATIONS

U.S. Patent Application Ser. No. 08/042,619, "Enhanced Reactive DC Sputtering System", Geoffrey Drummond.
U.S. Patent Application Ser. No. 07/998,513, "Enhanced Thin Film DC Plasma Processing System", Geoffrey Drummond.
The MDX as Strategic Tool in Reducing Arcing; Doug Schatz; 1985; pp. 1–7.
New Method of Arc Suppression for Reactive DC–Magnetron Sputtering; Williams, et al., pp.1–16.
Previously submitted with publication date listed as Sep. 20–25, 1995; however, it is unknown whether this document was actually published.
"New Method of Arc Suppression for Reactive DC Magnetron Sputtering:" Optical Society of American Annual Meeting, Sep. 20–25, 1992; 1992 Technical Digest Series vol. 23, pp. 1–16.

*Primary Examiner*—Nam Nguyen
*Attorney, Agent, or Firm*—Luke Santangelo

[57] ABSTRACT

Both methods and apparatus for achieving topologically precise thin film coating. The system focuses on coating systems to create compact discs using DC magnetron sputtering to avoid the occurrence of mousebites or visual imperfections at the termination edge on a masked substrate. Circuit elements are added to a switch-mode power supply which act to substantially reduce reverse currents after the signal is conditioned by rectifying and filtering a switched output. Fast acting diodes, placed in either series or parallel arrangements within the circuit involving the cathode and anode, are used with a low energy storage switch-mode power supply to completely eliminate the occurrence of mousebites on the aluminum coating or the polycarbonate substrate of the compact disc.

23 Claims, 5 Drawing Sheets

TOPOGRAPHICALLY PRECISE THIN FILM COATING SYSTEM

This is a continuation of application Ser. No. 07/954,151 field Sep. 30, 1992, and now abandoned.

BACKGROUND OF THE INVENTION

Generally this invention relates to the field of plasma-based thin film processing. Specifically, the invention focuses upon DC magnetron sputtering to coat a compact disc ("CD") and the like where precise edging is desired.

The sputtering process in general is well known in the art. It was apparently first reported in 1852 by Sir William Robert Groves. In 1921 Joseph John Thompson initially named the process "spluttering"; later the "1" was dropped and the name for the process became "sputtering". This term is now used to describe a process whereby atoms of a material are mechanically freed from the surface through a momentum transfer. The atoms then drift and eventually come in contact with a surface and cause a thin film on or interact with that surface or substrate. Although the sputtering process has been known for some time, in recent years applications of the process have grown dramatically and have been subject to refinement and development. To a significant degree, the increase and focus on the sputtering process has been due to the growth of the semi-conductor industry which has increased the focus on thin film processes and has made available more sophisticated equipment to practice the process.

To understand the interesting nature of the problem addressed by the present invention, it is necessary to generally understand magnetron sputtering. An excellent discussion of this process is contained in the text book Glow Discharge Processes by Brian Chapman published in 1980 by John Wiley & Sons, Inc., which is hereby incorporated by reference. As discussed with respect to the present invention, magnetron sputtering is a process whereby the surface of an item is coated. In basic form, the coating system involves an AC or DC power supply which, acting together with a magnetic field, ionizes a gas. The ions of this ionized gas or plasma then accelerate towards a target due to the presence of a DC potential created by the power supply. The target contains the material that will become the coating. When the ions strike the target, atoms of the target are released through momentum transfer. These atoms then drift free and some eventually contact a substrate and become a coating on that substrate. This substrate is often, but not necessarily, electrically disconnected from the power supply. As mentioned earlier, the sputtering process has been refined to allow tighter process control. In order to achieve this, it has been desirable to utilize switch-mode power supplies for a variety of reasons. These power supplies are fast acting in that they can react within nanoseconds to changing conditions such as that of the plasma involved. They are also power supplies which store low amounts of energy so that should an undesirable discharge occur, the amount of energy released to the process will be small enough so as to not significantly impact the process. Switch-mode power supplies are often also physically smaller than other types of designs.

Magnetron sputtering has a great variety of applications whether deposition or etching. Without limiting the application of the present invention, the present invention is discussed in the context of its utilization to coat a plastic or polycarbonate substrate with aluminum such as is accomplished in creating a compact disc. As a visual inspection of any compact disc will show, it is desirable to terminate the aluminum coating at some distance from the edge of the plastic substrate. This termination should be sharp and precise. This is accomplished by placing a mask over some portion of the substrate so areas are not coated. Unfortunately, for reasons not fully understood, small irregularities frequently occur. These irregularities are colloquially referred to as "mousebites". While in this particular application, the mousebites do not impact the performance of the coated item, they do represent a visual imperfection and so have been the focus of a number of attempts by those skilled in the art to avoid their occurrence. The problem, however, has proven to be enigmatic in that the solutions do not seem to conform to the present understanding of the nature of the problem. First, it appears from a microscopic examination of the irregularities that they are the result of local arcing and resultant damage of the thin coating. It has been discovered, however, that the utilization of higher energy storage power supplies (such as an SCR power supply) often completely eliminates the problem. This is paradoxical for two reasons. First, as mentioned earlier, in most applications the substrate is electrically disconnected from the power supply involved. By the very nature of the sputtering process, it would not be expected that the amount of energy storage in the power supply would have any impact on the existence or non-existence of mousebites. Second, even if one were to hypothesize some connection with the power supply, one would expect that the less energy stored there the less damage an arc would cause to the disc. The solution of using a high-stored-energy power supply, unfortunately, also eliminates the possibility of rapidly controlling the process as is possible through the use of a switch-mode power supply.

As a result of the limitations of the prior solution, almost universally, the solution implemented by those skilled in the art is to space the mask at some distance from the substrate. This can eliminate the local arcing that seems to be the direct cause of the mousebite phenomenon. Unfortunately, this solution results in a less focused edge and so it is not entirely satisfactory.

The present invention overcomes the need to accept either of the limitations of the prior solutions. It is an electrically-based solution involving a switch-mode power supply. Admittedly the present invention represents a solution to the problem which continues the enigmatic nature of the problem. As a result it can be said that it represents a non-obvious solution because even now the exact nature of the problem is not fully understood by those skilled in the art. Since the present invention represents a relatively simple solution, it underscores that the attempts by those skilled in the art to overcome the difficulties posed by the problem are a result of the difficulty in understanding the problem itself. Certainly, it can be said that those skilled in the art actually taught away from the direction taken by the present invention through their preconceptions concerning the nature of the problem. Thus, the result—complete elimination of the mousebite problem—is a totally unexpected result. Surprisingly, even though the problem of mousebites has existed for some time, and even though the implementing arts were easily available, the solution of the present invention fulfills the need through a very simple and straightforward technique.

SUMMARY OF THE INVENTION

The present invention involves a plasma-based thin film processing system in which a switch-mode power supply includes a seemingly redundant circuit element to eliminate reverse currents within the output circuitry. This circuit element may be located within the power supply itself and acts to eliminate any reverse current as might flow within the plasma itself. For reasons not fully understood, this acts to eliminate any occurrence of mousebites, even when the substrate is electrically disconnected from the power supply circuitry. A number of embodiments through which to achieve these ends are disclosed so that the invention might be readily implemented in a variety of thin film processing systems.

It is a goal of the present invention to accommodate a variety of thin film processes. While the invention is described with particular reference to a CD coating system based upon DC magnetron sputtering, it is a goal to provide a solution which may be implemented in any process or instance where topographically precise coating using any plasma-based system is desired. In doing so, a goal is to allow the use of switch-mode power supplies in a manner which avoids imperfections and which can be readily achieved through electrical techniques. It is also a goal to present designs from which refinements and changes can be derived as appropriate for specific applications.

A further goal of the present invention is to eliminate transient reverse currents which are of such a nature as to negatively impact the thin film processing desired. It is thus an object to provide a variety of techniques so that these ends might be achieved in manners which can accommodate existing design constraints. As part of this goal, it is a desire to allow the utilization of a simple circuit element which may be readily implemented in existing designs.

Another goal of the present invention is to present a modification to existing CD processing systems through which refined techniques can be utilized without undesirable side effects. Specifically, it is a goal to allow the design of processing systems which improve performance from the manufacturers perspectives. As one of these goals, it is an object to provide an implementation of the present invention which not only avoids the mousebite problem, but which also enhances the process.

Naturally, further objects of the invention are disclosed throughout other areas of the specification and claims.

DETAILED DESCRIPTION OF THE PREFERRED EMBODIMENTS

Figure 1:
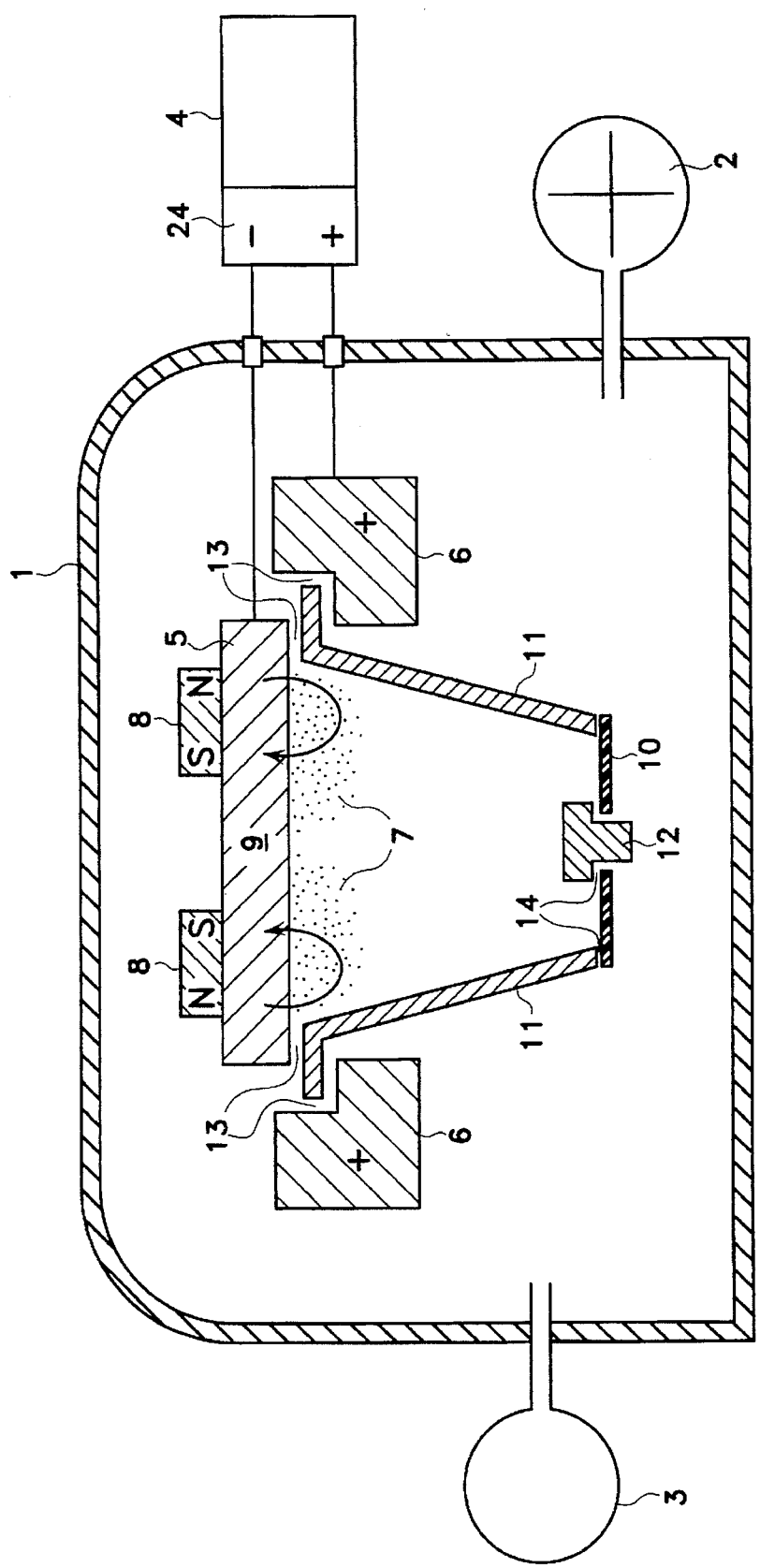
FIG. 1 represents a schematic view of a magnetron sputtering system designed to coat a compact disc substrate.

The basic concepts of the present invention may be implemented in a variety of ways. As mentioned, it is helpful to understand the sputtering system in general in order to understand the broad scope and application of the present invention. FIG. 1 shows a schematic representation of a DC magnetron sputtering system designed for coating a CD substrate. As can be seen, coating chamber (1) is designed to control the environment within it for thin film processing. This environment is typically maintained at low pressure through vacuum pump (2). In addition, processing gas or gases (3) may be introduced as required for a specific process. To achieve processing, switch-mode power supply (4) provides power to cathode (5) and anode (6) within coating chamber (1) through inclusion of transient reverse current element (24). As a result of switch-mode power supply (4), DC electrical fields are induced between cathode (5) and anode (6) which cause ionization of the gases present to cause a glow discharge or plasma (7) in addition to creating an accelerating potential to direct the ions to the target. In a magnetron sputtering system, the process is enhanced through the inclusion of magnetic field means (8) as is well known in the art. Thus, through the action of switch-mode power supply (4) processing gas (3) acts as an ion source through which ions impact upon cathode (5).

In some systems, cathode (5) is connected to a target material supplied within coating chamber (1). This target material then serves as the coating material. In the system as shown, cathode (5) is actually a piece of solid aluminum and thus cathode (5) itself serves as material target (9). (Naturally other materials might be involved as well.) Thus, when ions from plasma (7) impinge upon material target (9), through momentum transfer particles of aluminum are released. This aluminum then disperses and coats any surface which it contacts. Because of the geometrical arrangement within coating chamber (1), the aluminum disperses and a portion of it impacts and therefore coats substrate (10). In this fashion, cathode (5) and anode (6) act to deposit a coating material upon a substrate. The ion source allows the electric fields between cathode and anode to create plasma (7) from which ions are directed at material target (9) to dislodge coating material. By providing an open path from material target (9) to substrate (10) the system allows the dislodged coating material to deposit on substrate (10).

In the particular application of creating compact discs, included within coating chamber (1) is a masking element. As can be understood from the cross-sectional view shown in FIG. 1, a masking element can include outer mask (11) and inner mask (12). While shown in cross section, outer mask (11) is actually a truncated hollow conical structure which shields other portions of coating chamber (1) from the dislodged coating material. As shown, outer mask (11) terminates in the vicinity of both cathode (5) and anode (6). In most applications, outer mask (11) is electrically insulated from both cathode (5) and anode (6). As shown, gaps (13) isolate outer mask (11). Importantly, the narrow end of outer mask (11) terminates in the vicinity of substrate (10) and thus serves to shield or mask the outer edge of substrate (10) from exposure to the dislodged coating material. As shown in FIG. 1, substrate gap (14) may exist between outer mask (11) and substrate (10). While in the prior art, substrate gap (14) needed to be chosen to be sufficiently large so as to avoid the appearance of mousebites upon substrate (10), according to the present invention this gap can be very small or indeed may be non-existent. The mask may engage the substrate. To similarly shield the inner portion of substrate (10) in the CD application, a masking element also includes an inner mask (12) which again may or may not be similarly spaced with respect to substrate (10). When no gap is present, a masking element may actually engage substrate (10).

Figure 2A:
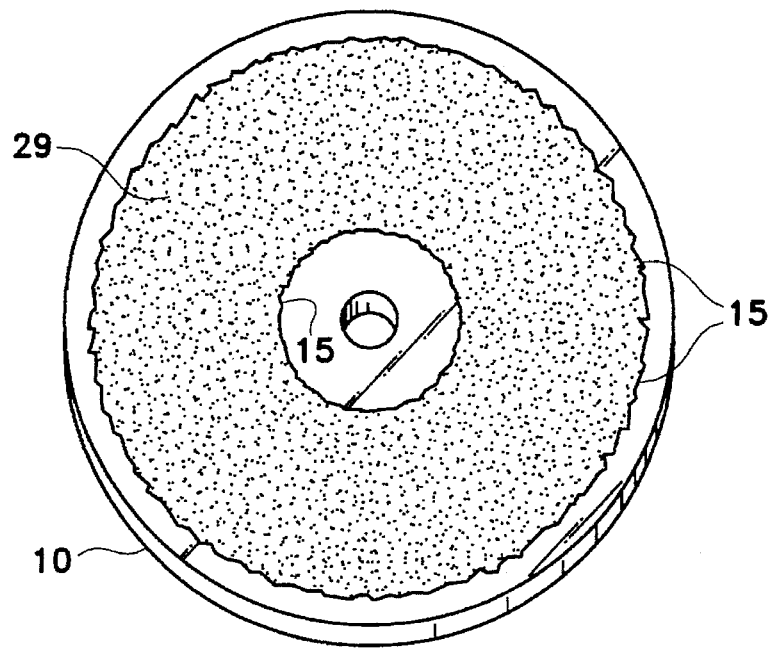
FIG. 2a is a top view of a coated substrate showing the mousebite problem as experienced prior to the present invention.
Figure 2B:
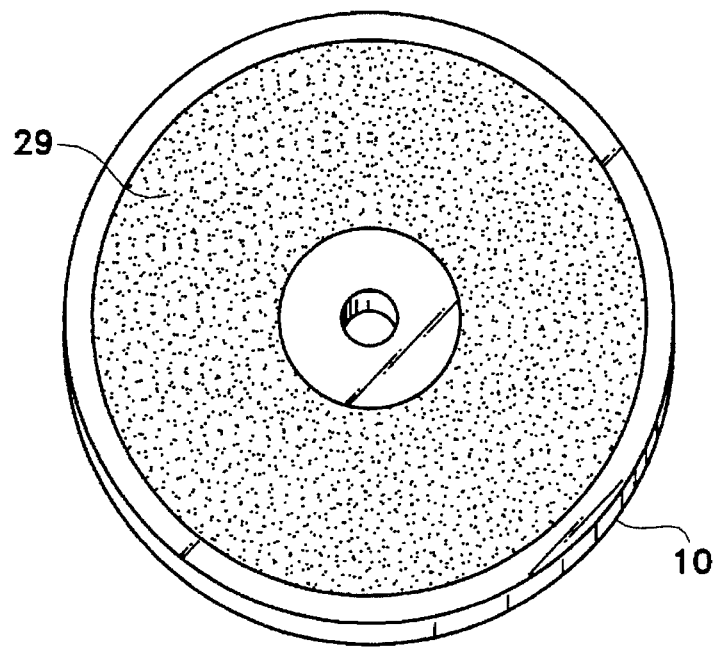
FIG. 2b is a top view of a coated substrate after implementation of the present invention.

Referring to FIGS. 2a and 2b, it can be understood how aluminum is sputtered upon the substrate to create the desired compact disc. Both parts of the figure show substrate

(10) from the top as an annular disc with a central hole for purposes of discussion only. Substrate (10) may be made of some plastic polycarbonate, glass, or some other electrically non-conductive material. It is also believed that substrate (10) may even be made of an electrically conductive material. With respect to the material chosen for substrate (10), it should be understood that since the exact reason why the present invention works is not fully understood, although the substrate is claimed as some non-conductive material, this may not prove to be a necessary limitation. Accordingly, those claims not including such limitations should be interpreted so as to include any type of substrate or other item which might be selected. Because substrate (10), and indeed the mask (which is often selected from copper or other such metallic material) are electrically disconnected from switch-mode power supply (4), it is believed that the nature of the materials chosen will not affect the operation of the present invention. It can be said with certainty, however, that when the combination of a copper mask and polycarbonate substrate are involved, the present invention completely eliminates the problem of mousebites. It is believed that a total solution would also exist with other materials as well.

Referring to FIG. 2a, the problem of mousebites can be seen. As shown for this particular application only, the aluminum coating results in a single annular surface the coated portion (29). Both the inner and outer edges of this annular surface are shown with some imperfections, namely, the mousebites (15). For reasons not clearly understood at present, the inner edge typically shows less evidence of mousebites than the outer edge. As shown in FIG. 2b, however, the annular surface terminates in a clean, topographically precise manner as a result of the implementation of the present invention.

Figure 3:
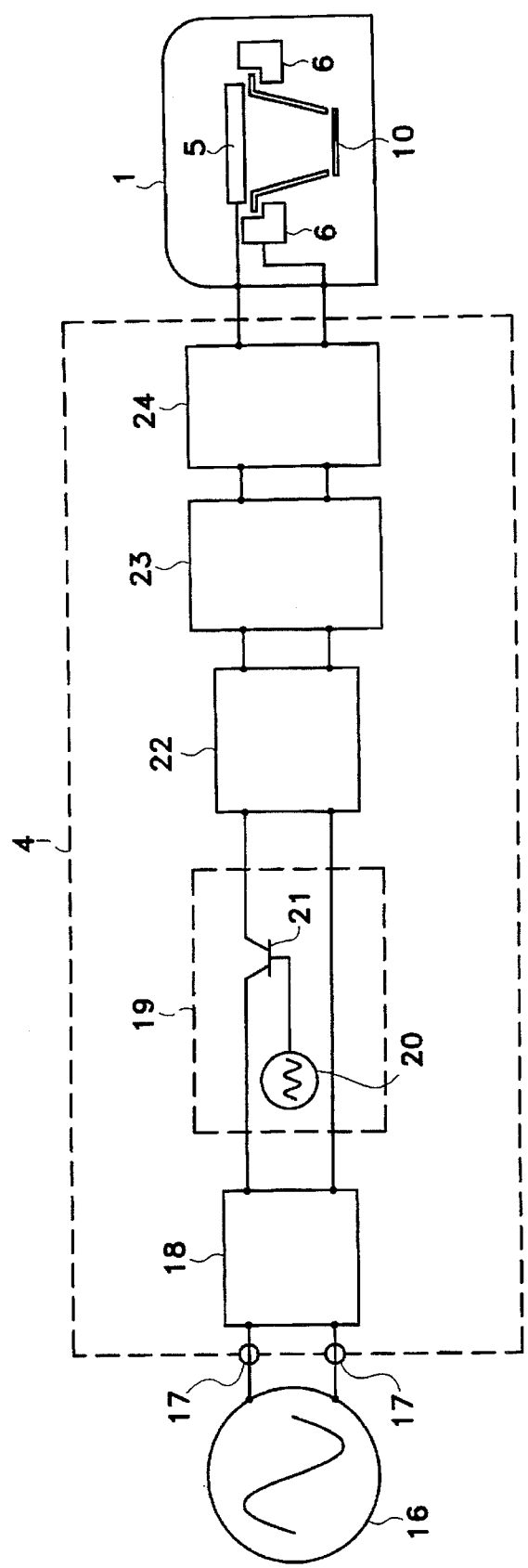
FIG. 3 is a schematic view of a switch-mode power supply modified according to the present invention for use with a coating chamber.

In FIG. 3, the details of the switch-mode power supply and the present invention may be more readily understood. As shown schematically in FIG. 3, switch-mode power supply (4) involves a number of components. Overall these components act to accept a typically alternating power input and to convert it to a direct current power output in a fashion which affords the low energy storage and fast reaction advantages mentioned earlier. Switch-mode power supply (4) derives its power from primary power source (16) through connections (17) which act as an AC input which may be a voltage or current input to supply alternating power. This alternating power is at a predominant frequency. In many applications, this alternating power might be line voltage which is often at a relatively low frequency such as 50 or 60 cycles per second. The alternating power is then acted upon by some type of AC–DC converter (18). AC–DC converter (18) is circuitry such as is well known in the art which acts to convert the alternating power to a direct current. This direct current may or may not be conditioned to smooth or make more uniform the waveform resulting. The direct current is then acted upon by switch (19) to create another alternating signal which is at a higher frequency than the frequency of that supplied by primary source (16). As can be understood from the schematic diagram, switch (19) may include a high frequency oscillator (20) and a switching element (21) to create the alternating signal. For example, while primary power source (16) may operate in the 60 Hz range, high frequency oscillator (20) may operate at from 20 to 200 kHz. This alternating signal may or may not be conditioned to create a more uniform waveform. As shown, however, the signal is not conditioned and a truly switched output results. This alternating signal is then acted upon by rectifier (22) and may also be acted upon by filter (23) to, again as is well known in the art, transform the alternating signal into a direct current power output. In prior art designs, at this point the direct current power output would be furnished to the coating chamber (1) to drive the particular process involved. In the present invention switch-mode power supply (4) includes a transient reverse current element (24) prior to its output to coating chamber (1).

The transient reverse current element (24) has a number of important features. First, it may be disposed within switch-mode power supply (4) so as to affect the output after it has been acted upon by rectifier (22). It may also, as shown, be disposed after filter (23). As such it is an element within a load circuit loop (30) which includes cathode (5) and anode (6). That this produces the desired result is surprising from a number of perspectives. As mentioned earlier, because substrate (10) is electrically disconnected from the elements within coating chamber (1) which are acted upon by switch-mode power supply (4), it would not be expected that transient reverse currents would effectively have an impact upon the occurrence of the mousebite problem. Second, as those skilled in the art will readily understand, rectifier (22) already acts to limit the direction of current in rectifying the alternating signal. Because of this it might not be expected that the inclusion of a transient reverse current element (24) would cause any effect. As shown, a transient reverse current element (24) is placed at a point after the signal is acted upon by rectifier (22). The reason that inclusion of a transient reverse current element (24) has any effect is related to the filter (23) interposed between rectifier (22) and a transient reverse current element (24). This filter element acts to store energy and thus permit transient reverse current flow in the plasma before the rectifier (22) can act to prevent it. It is this transient reverse current which appears to create or act to enhance the creation of mousebites. This is surprising because a transient reverse current element (24) affects current within the load circuit loop (30) involving cathode (5) and anode (6), and these currents are not currents within a circuit which involves substrate (10).

In addition, transient reverse current element (24) involves reverse currents. Since the output of switch-mode power supply (4) is often a direct current power output, transient reverse current element (24) has no significant effect upon the typical, desired direct current power output. It is only reverse currents, (presumably, discharges back into the power supply against its normal output) which are substantially reduced. By substantially, it is meant that the degree of reduction on either a time or current basis is achieved of sufficient magnitude in order to prevent the occurrence of the mousebites. Naturally, the degree of reduction necessary may vary with the application or process involved.

Finally, transient reverse current element (24) may react rapidly to reduce transient currents. Since these transient reverse currents appear to occur on a micro- or nanosecond level, the a transient reverse current element (24) must be of such a design as to react within this timeframe. In this regard it has been discovered that slower reacting devices do not overcome the problem of mousebites in a typical CD processing system; in this application, the device must react fast. Other applications may be afforded greater latitude in this regard. Thus, while it is not intended to serve as a required limit to the coverage of every claim in the patent granted on this invention, in the present designs and systems, it appears that utilizing components which react in less than about one hundred nanoseconds are adequate.

The speed with which transient reverse current element (24) reacts is an aspect which further highlights the paradoxical nature of the present invention. Rather than apparently being dependent upon the speed at which high frequency oscillator (20) causes switching of switching element (21), in order to be effective in the present application, it appears that the reaction time is related to the amount of energy stored within switch-mode power supply (4). In this regard, it is believed that the higher the amount of energy stored within switch-mode power supply (4), the faster transient reverse current element reverse currents (24) must react. By defining "low energy storage" through an energy storage factor defined as the ratio of the energy delivered by the power supply in one cycle of the primary power source to the energy stored in the supply, it may be said that low energy storage power supplies are ones for which the energy storage factor is greater than approximately 100. In the CD application discussed, it has been discovered that when systems are designed with power supplies which are not low energy storage power supplies (storage factors less than 10), the mousebite problem does not exist. In sharp contrast, in the application discussed extremely low energy storage power supplies are used. In this application the energy storage factor is approximately 300 and the mousebite problem is acute.

From the effect of energy storage, it is believed that transient reverse current element (24) need only react rapidly so that a significant amount of the energy stored in switch-mode power supply (4) does not undesirably affect the thin film processing within coating chamber (1). Thus, the lower the energy storage factor, the faster transient reverse current element reverse currents (24) must react. The paradox lies in that this would lead one to believe that when one had a high energy storage power supply (much less than 100 energy storage factor) one would need a transient reverse current element which reacts extremely rapidly. In fact, at this energy storage level the means is not even necessary. Again, this highlights the enigmatic and non-obvious nature of the solution discovered by the present invention.

Figure 4:
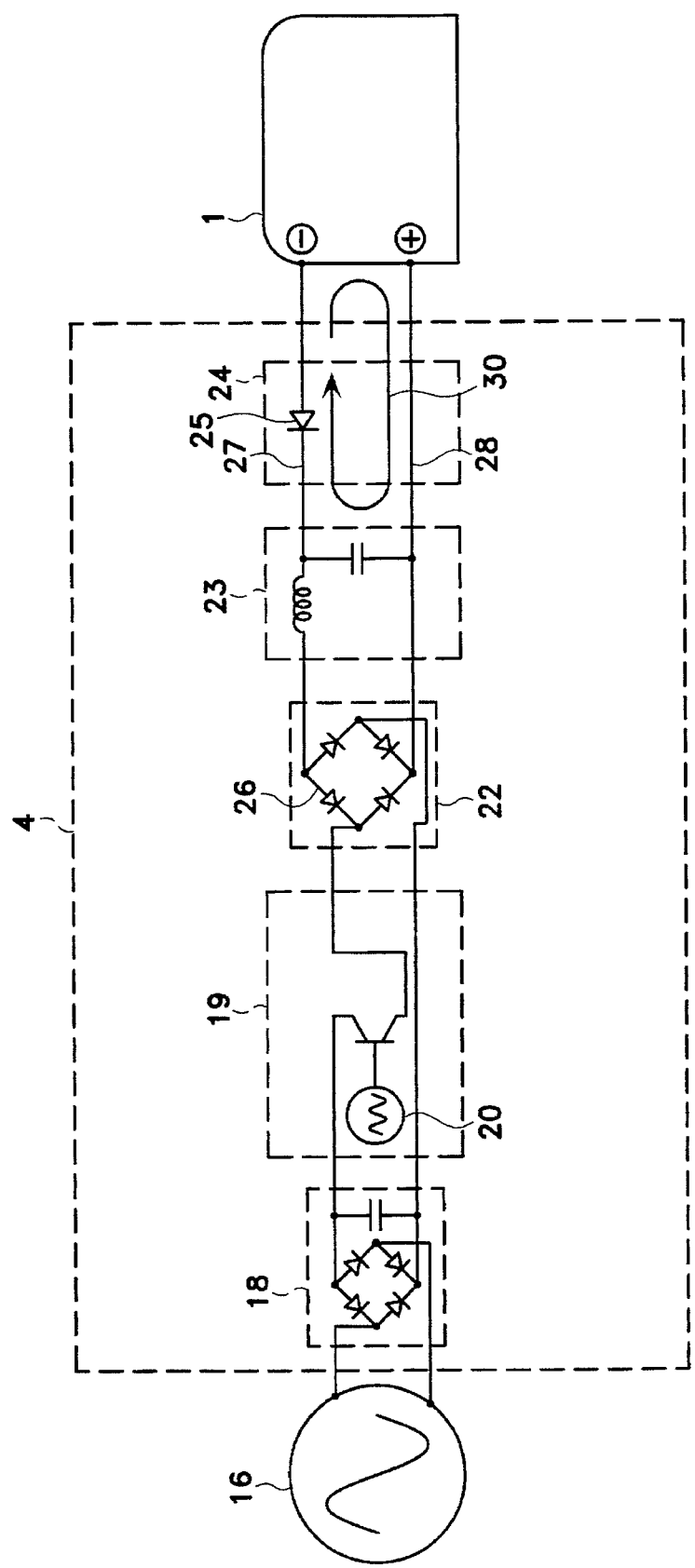
FIG. 4 is a circuit diagram showing a series embodiment of the present invention.
Figure 5:
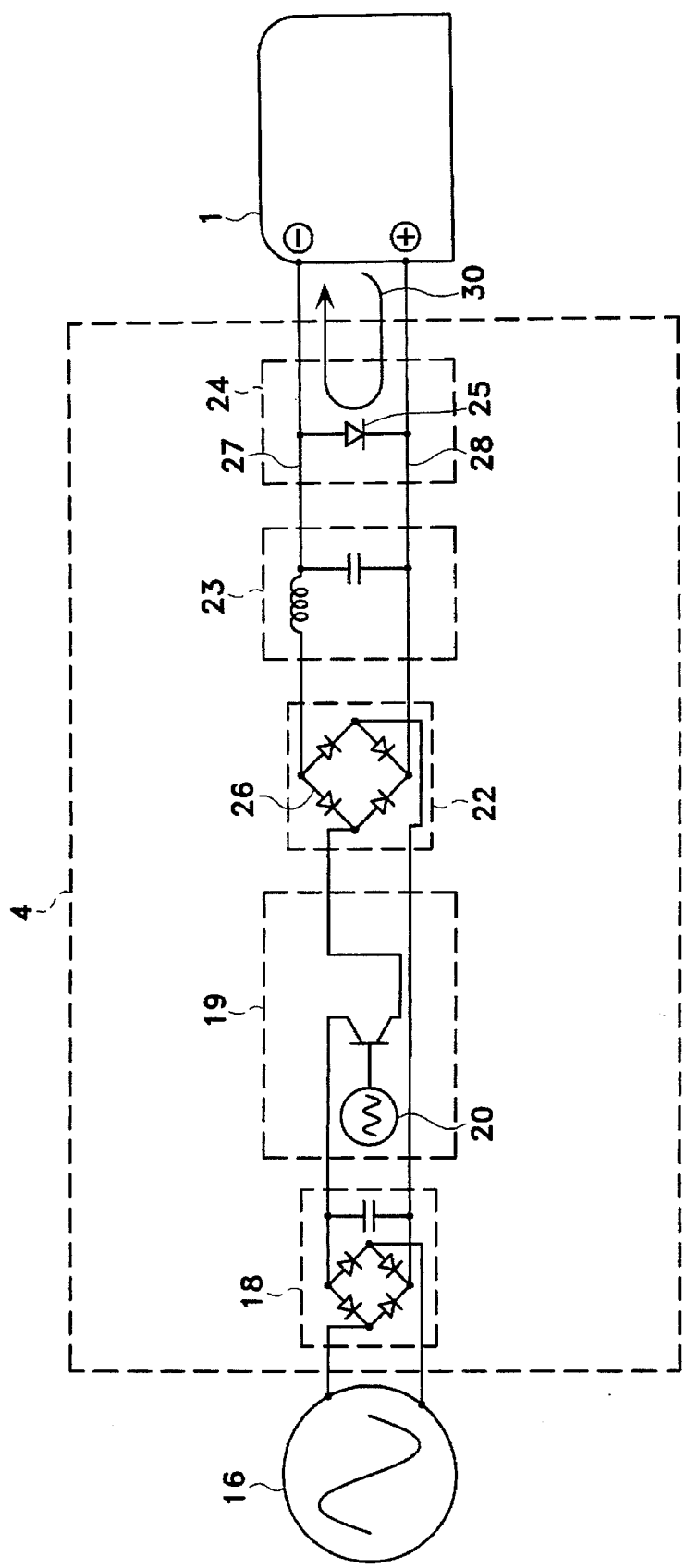
FIG. 5 is a circuit diagram showing a parallel embodiment of the present invention.

Having described schematically the device of the present invention, specific embodiments can now be understood. Referring to FIGS. 4 and 5, it can be seen that the addition of relatively simple circuit elements are possible to achieve the present invention. FIG. 4 shows the specific circuit designs within switch-mode power supply (4). As shown, circuit components can be grouped according to their functions. As those skilled in the art would readily understand, AC-DC converter (18), switch (19), rectifier (22), and filter (23) each involve known circuitries. Importantly, as shown in both FIGS. 4 and 5, switch-mode power supply (4) includes transient reverse current element (24). As shown in the embodiment in FIG. 4, the transient reverse current element (24) may be a very basic circuit device, a diode. As shown in FIG. 4, this may be the inclusion of fast diode element (25) connected along first lead (27). Through this connection, fast diode element (25) acts to block or substantially reduce any reverse currents within a circuit involving cathode (5) and anode (6).

As shown in FIG. 4, it can be seen that transient reverse current element (24) is positioned after rectifier (22) and filter (23) so that it affects the output after it is acted upon by rectifier (22). It may also be positioned after filter (23) or some other element which acts to allow a reverse current path and thus creates load circuit loop (30). This element may be anything. Although shown as filter (23), it could be rectifier (22) (if "slow" diodes were used) or any other element and be an equivalent of that which is disclosed and claimed. In the embodiment shown, this is an aspect which highlights how the seemingly simple inclusion of fast diode element (25) is not an obvious modification. As those skilled in the art readily understand, rectifier (22) usually functions to rectify an alternating signal by limiting reverse currents. Hence, as shown it can be seen that the circuitry and rectifier (22) includes other diode devices (26) which act to block reverse currents. Because of this nature, those skilled in the art have not, prior to the present invention, recognized that merely blocking reverse currents in this fashion would in fact achieve a substantial reduction in transient reverse currents. This is one of the reasons why the solutions of the present invention were not pursued even though the devices and implementing arts have long been available.

FIG. 5 shows a parallel embodiment in which fast diode element (25) is connected across first lead (27) and second lead (28). The action of the diode element (25) is such that the voltage on cathode (5) cannot become positive with respect to anode (6), by absorbing any reverse current which would cause such a positive voltage. This embodiment involves many of the features discussed with respect to that shown in FIG. 4 and has been found to also achieve the complete elimination of the mousebite problem.

As shown in both FIGS. 4 and 5, transient reverse current element (24) utilizes a diode to achieve its goals. Naturally, a variety of other techniques could also be utilized. This might include switching to block or redirect transient reverse currents or other techniques as those skilled in the art would readily recognize once they understand the broad goal to be achieved by transient reverse current element (24). As those skilled in the art would readily understand, since the design of the power supply may vary, the invention may be achieved through other circuit designs and elements which are dependent upon the specific power supply design but which act to achieve the same ends.

The foregoing discussion and the claims which follow describe the preferred embodiments of the present invention. Particularly with respect to the claims, it should be understood that changes may be made without departing from its essence. In this regard, it is intended that such changes would still fall within the scope of the patent granted on the present invention. It simply is not practical to describe and claim all possible revisions to the present invention which may be accomplished. Permutations and combinations of all elements in the claims may also be made beyond those presented to accommodate various needs and applications. To the extent any such revisions utilize the essence of the present invention, each would naturally fall within the breadth of protection encompassed by this patent. This is particularly true for the present invention since its basic concepts and understandings are fundamental in nature and can be broadly applied and since its teachings may be adapted to a variety of processing systems.

I claim:

1. A topographically precise thin film coating system comprising:
   a. a coating chamber;
   b. a material target disposed to expose coating material within said chamber;
   c. a cathode within the deposition chamber;
   d. an anode within the deposition chamber;
   e. a DC power source wherein said DC power source is connected across said anode and said cathode;
   f. a filter element which creates a load circuit loop with said cathode and said anode; and
   g. a transient reverse current element within said load circuit loop.

2. A topographically precise thin film coating system as described in claim 1 wherein said coating material comprises aluminum.

3. A topographically precise thin film coating system as described in claim 1 and further comprising a masking element which covers a portion of said substrate to be coated.

4. A topographically precise thin film coating system as described in claim 3 wherein said masking element engages said substrate.

5. A topographically precise thin film coating system as described in claim 4 wherein said substrate comprises a substance which is polycarbonate.

6. A topographically precise thin film coating system as described in claim 5 wherein said DC power source comprises a low energy storage power supply.

7. A topographically precise thin film coating system as described in claim 5 wherein said DC power source comprises a switch-mode power supply.

8. A topographically precise thin film coating system as described in claim 7 wherein said switch-mode power supply comprises:

a. an AC input;
   b. an AC-DC converter which is responsive to said AC input to create direct current;
   c. a switch which acts upon said direct current to create an alternating signal at a higher frequency;
   d. a rectifier which acts upon said alternating signal to create a direct current power output;
   e. a filter which acts upon said direct current power output; and
   f. a diode which is disposed to affect said output after it is acted upon by said filter.

9. A topographically precise thin film coating system as described in claim 5 wherein said transient reverse current element comprises a diode element.

10. A topographically precise thin film coating system as described in claim 4 wherein said substrate comprises a substance which is glass.

11. A topographically precise thin film coating system as described in claim 4 wherein said substrate comprises a substance which is an electrically nonconductive material.

12. A topographically precise thin film coating system as described in claim 1 wherein said DC power source comprises a first lead and a second lead and wherein said transient reverse current element comprises an element within said circuit connected along one of said leads which reacts rapidly to reduce reverse currents.

13. A topographically precise thin film coating system as described in claim 1 wherein said DC power source comprises a first lead and a second lead and wherein said transient reverse current element comprises an element within said circuit connected across said first and said second leads which reacts rapidly to reduce reverse currents.

14. A method of coating a substrate with a thin film in a topographically precise manner comprising the steps of:

a. supplying a target material within a coating chamber;
   b. furnishing direct current power to said coating chamber through a circuit having an anode and a cathode;
   c. filtering said direct current power by a filter element which creates a load circuit loop with said cathode and said anode; and
   d. causing deposition of a thin film of coating material upon said substrate; while
   e. substantially reducing any transient reverse currents in said load circuit loop.

15. A method of coating a substrate with a thin film in a topographically precise manner as described in claim 14 wherein said step of causing deposition of a thin film of coating material upon said substrate comprises the steps of:

a. Creating ions within said coating chamber;
   b. directing said ions at said target material to dislodge aluminum;
   c. allowing said dislodged aluminum to deposit on said substrate.

16. A method of coating a substrate with a thin film in a topographically precise manner as described in claim 14 and further comprising the step of masking a portion of said substrate.

17. A method of coating a substrate with a thin film in a topographically precise manner as described in claim 16 wherein said step of masking a portion of said substrate comprises the step of engaging said substrate by said mask.

18. A method of coating a substrate with a thin film in a topographically precise manner as described in claim 17 wherein said substrate comprises a substance which is polycarbonate.

19. A method of coating a substrate with a thin film in a topographically precise manner as described in claim 18 wherein said step of furnishing direct current power comprises the step of creating a direct current power output and wherein said step of reducing said reverse currents comprises the step of supplying a diode in said circuit at a point after creating said direct current power output.

20. A method of coating a substrate with a thin film in a topographically precise manner as described in claim 19 wherein said circuit has leads connected to said anode and said cathode and wherein said step of supplying a diode in said circuit comprises the step of connecting said diode across said leads.

21. A method of coating a substrate with a thin film in a topographically precise manner as described in claim 19 wherein said circuit has leads connected to said anode and said cathode and wherein said step of supplying a diode in said circuit comprises the step of connecting said diode along one of said leads.

22. A method of coating a substrate with a thin film in a topographically precise manner as described in claim 17 wherein said substrate comprises a substance which is an electrically nonconductive material.

23. A method of coating a substrate with a thin film in a topographically precise manner as described in claim 16 wherein said step of furnishing direct current power comprises the step of utilizing a switch-mode power supply.

\* \* \* \* \*